(12) United States Patent
Seo et al.

(10) Patent No.: US 10,629,769 B2
(45) Date of Patent: Apr. 21, 2020

(54) SOLAR CELL AND METHOD OF MANUFACTURING THE SAME

(71) Applicant: JUSUNG ENGINEERING CO., LTD., Gwangju-si, Gyeonggi-do (KR)

(72) Inventors: Jeong Ho Seo, Gwangju-si (KR); Soon Bum Kwon, Gwangju-si (KR); Ki-Duck Kim, Gwangju-si (KR); Jong In Kim, Gwangju-si (KR); Chang Kyun Park, Gwangju-si (KR); Won Suk Shin, Gwangju-si (KR); Kyoung Jin Lim, Gwangju-si (KR); Beop Jong Jin, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 10 days.

(21) Appl. No.: 15/738,120

(22) PCT Filed: Aug. 21, 2017

(86) PCT No.: PCT/KR2017/009075
§ 371 (c)(1),
(2) Date: Mar. 1, 2018

(87) PCT Pub. No.: WO2018/038478
PCT Pub. Date: Mar. 1, 2018

(65) Prior Publication Data
US 2018/0358506 A1    Dec. 13, 2018

(30) Foreign Application Priority Data

Aug. 24, 2016 (KR) .......................... 10-2016-0107619

(51) Int. Cl.
*H01L 31/20* (2006.01)
*H01L 31/0747* (2012.01)
(Continued)

(52) U.S. Cl.
CPC ........ *H01L 31/208* (2013.01); *H01L 21/0234* (2013.01); *H01L 21/3065* (2013.01);
(Continued)

(58) Field of Classification Search
CPC ............... H01L 31/208; H01L 31/0747; H01L 31/1884; H01L 31/202; H01L 31/04;
(Continued)

(56) References Cited

U.S. PATENT DOCUMENTS

| | | | | |
|---|---|---|---|---|
| 5,935,344 A | * | 8/1999 | Endo | ..................... H01L 31/202 |
| | | | | 136/255 |
| 2012/0318336 A1 | * | 12/2012 | Hekmatshoar-Tabari | .................... |
| | | | | H01L 31/035236 |
| | | | | 136/255 |
| 2015/0236182 A1 | * | 8/2015 | Moslehi | .............. H01L 31/0475 |
| | | | | 136/249 |

FOREIGN PATENT DOCUMENTS

| | | | |
|---|---|---|---|
| KR | 20100130044 A | 12/2010 | |
| WO | 2013069324 A1 | 5/2013 | |
| WO | WO-2013069324 A1 * | 5/2013 | ..... H01L 31/022433 |

* cited by examiner

*Primary Examiner* — Michael Y Sun
(74) *Attorney, Agent, or Firm* — Renaissance IP Law Group LLP

(57) ABSTRACT

The present invention provides a method of manufacturing a solar cell, the method including: a process of forming a first semiconductor layer on an upper surface of a semiconductor wafer and forming a second semiconductor layer, having a polarity different from a polarity of the first semiconductor layer, on a lower surface of the semiconductor wafer; a process of forming a first transparent conductive layer on an upper surface of the first semiconductor layer to externally expose a portion of the first semiconductor layer and forming a second transparent conductive layer on a lower surface of the second semiconductor layer to externally expose a portion of the second semiconductor layer;

(Continued)

and a plasma treatment process on at least one of the first transparent conductive layer and the second transparent conductive layer, wherein the plasma treatment process includes a process of removing the externally exposed portion of the first semiconductor layer and the externally exposed portion of the second semiconductor layer.

9 Claims, 7 Drawing Sheets

(51) Int. Cl.
*H01L 31/18* (2006.01)
*H01L 31/0352* (2006.01)
*H01L 21/3065* (2006.01)
*H01L 21/02* (2006.01)
H01L 31/075 (2012.01)
H01L 31/072 (2012.01)
H01L 31/06 (2012.01)
H01L 31/0224 (2006.01)
H01L 21/268 (2006.01)
H01L 31/068 (2012.01)
H01L 31/0236 (2006.01)
H01L 31/056 (2014.01)
H01L 21/3213 (2006.01)
H01L 21/768 (2006.01)

(52) U.S. Cl.
CPC .. *H01L 31/035281* (2013.01); *H01L 31/0747* (2013.01); *H01L 31/1884* (2013.01); *H01L 31/202* (2013.01); H01L 21/268 (2013.01); H01L 21/32136 (2013.01); H01L 21/76826 (2013.01); H01L 31/0236 (2013.01); H01L 31/022433 (2013.01); H01L 31/022466 (2013.01); H01L 31/022483 (2013.01); H01L 31/056 (2014.12); H01L 31/06 (2013.01); H01L 31/068 (2013.01); H01L 31/072 (2013.01); H01L 31/075 (2013.01); H01L 31/1804 (2013.01); H01L 31/20 (2013.01)

(58) Field of Classification Search
CPC ............. H01L 31/0236; H01L 31/0224; H01L 31/0445; H01L 31/18; H01L 21/3065; H01L 21/0234; H01L 31/035281; H01L 21/32136; H01L 21/76826; H01L 31/022483; H01L 31/056; H01L 31/022433; H01L 31/022466; H01L 21/268; H01L 31/068; H01L 31/1804; H01L 31/075; H01L 31/072; H01L 31/20; H01L 31/06; H01L 31/186; H01L 31/1888; Y02E 10/50; Y02P 70/521
See application file for complete search history.

SOLAR CELL AND METHOD OF MANUFACTURING THE SAME

TECHNICAL FIELD

The present invention relates to a solar cell, and more particularly, to a solar cell based on a combination of a wafer type solar cell and a thin film type solar cell.

BACKGROUND ART

Solar cells are devices that convert light energy into electrical energy, based on a characteristic of a semiconductor.

The solar cells have a PN junction structure where a positive (P)-type semiconductor and a negative (N)-type semiconductor are joined to each other. When sunlight is incident on a solar cell having the PN junction structure, a hole and an electron are generated in the semiconductors by energy of the incident sunlight. At this time, due to an electric field which is generated in a PN junction, the hole (+) moves to the P-type semiconductor, and the electron (−) moves to the N-type semiconductor, thereby generating an electric potential to produce power.

The solar cells may be categorized into wafer type solar cells and thin film type solar cells.

The wafer type solar cells are solar cells which are manufactured by using a semiconductor material itself, such as a silicon wafer, as a substrate. The thin film type solar cells are solar cells which are manufactured by forming a semiconductor on a substrate such as glass in a thin film type.

The wafer type solar cells are better in efficiency than the thin film type solar cells, and the thin film type solar cells have an advantage where the manufacturing cost is reduced in comparison with the wafer type solar cells.

Therefore, solar cells based on a combination of the wafer type solar cell and the thin film type solar cell have been proposed. Hereinafter, a related art solar cell will be described with reference to the drawings.

FIGS. 1A to 1E are schematic process cross-sectional views illustrating a process of manufacturing a solar cell according to an embodiment of the related art.

First, as seen in FIG. 1A, a semiconductor wafer 10 is prepared.

Subsequently, as seen in FIG. 1B, a first semiconductor layer 20 is formed on an upper surface of the semiconductor wafer 10, and a second semiconductor layer 30 is formed on a lower surface of the semiconductor wafer 10. In this case, due to a process characteristic, the first semiconductor layer 20 is formed up to a side surface of the semiconductor wafer 10 as well as the upper surface of the semiconductor wafer 30, and the second semiconductor layer 30 is formed up to the side surface of the semiconductor wafer 10 as well as the lower surface of the semiconductor wafer 10. Therefore, as illustrated, the first semiconductor layer 20 and the second semiconductor layer 30 may be connected to each other at the side surface of the semiconductor wafer 10.

Subsequently, as seen in FIG. 1C, a first transparent conductive layer 40 is formed on an upper surface of the first semiconductor layer 20, and a second transparent conductive layer 50 is formed on a lower surface of the second semiconductor layer 30. In this case, due to the process characteristic, the first transparent conductive layer 40 is formed up to a side surface of the first semiconductor layer 20 as well as the upper surface of the first semiconductor layer 20, and the second transparent conductive layer 50 is formed up to a side surface of the second semiconductor layer 30 as well as the lower surface of the second semiconductor layer 30. Therefore, as illustrated, the first transparent conductive layer 40 and the second transparent conductive layer 50 may be connected to each other at the side surface of the semiconductor wafer 10.

Subsequently, as seen in FIG. 1D, a first electrode 60 is formed on an upper surface of the first transparent conductive layer 40, and a second electrode 70 is formed on a lower surface of the second transparent conductive layer 50.

Subsequently, as seen in FIG. 1E, a separation part 80 is formed by removing an edge area of each of the first transparent conductive layer 40, the first semiconductor layer 20, and the semiconductor wafer 10.

An electrical connection between the first transparent conductive layer 40 and the second transparent conductive layer 50 which is made at the side surface of the semiconductor wafer 10 is cut off by the separation part 80, and an electrical connection between the first semiconductor layer 20 and the second semiconductor layer 30 which is made at the side surface of the semiconductor wafer 10 is cut off by the separation part 80, thereby preventing occurrence of short circuit therebetween.

However, the method of the related art has the following drawbacks.

First, in the related art, the separation part 80 is formed for preventing short circuit in the above-described process of FIG. 1E, and in this case, a carrier such as a hole or an electron is trapped in the separation part 80 area, causing a problem where an efficiency of the solar cell is reduced.

Moreover, referring to an enlarged view referred to by an arrow of FIG. 1E, particles 90 which are pollutant components can be located on the upper surface of the first transparent conductive layer 40 and the lower surface of the second transparent conductive layer 50. The particles 90 can occur in a process of forming the first transparent conductive layer 40 and the second transparent conductive layer 50 and can also occur in a process of forming the separation part 80. As described above, if the particles 90 are located on the upper surface of the first transparent conductive layer 40 and the lower surface of the second transparent conductive layer 50, a transmittance of sunlight is reduced by the particles 90, and moreover, a flow of a current is hindered by the particles 90, causing a problem where an efficiency of the solar cell is reduced.

DISCLOSURE

Technical Problem

The present invention is devised to solve the above-described problems of the related art, and an object of the present invention is to provide a solar cell and a method of manufacturing the same, in which even without forming a separation part, short circuit is prevented from occurring in a side surface of a semiconductor wafer, and moreover, particles provided on a transparent conductive layer are effectively removed, thereby enhancing efficiency.

Technical Solution

To accomplish the above-described object, the present invention provides a method of manufacturing a solar cell, the method including: a process of forming a first semiconductor layer on an upper surface of a semiconductor wafer and forming a second semiconductor layer, having a polarity different from a polarity of the first semiconductor layer, on a lower surface of the semiconductor wafer; a process of forming a first transparent conductive layer on an upper surface of the first semiconductor layer to externally expose a portion of the first semiconductor layer and forming a second transparent conductive layer on a lower surface of the second semiconductor layer to externally expose a portion of the second semiconductor layer; and a plasma treatment process on at least one of the first transparent conductive layer and the second transparent conductive layer, wherein the plasma treatment process includes a process of removing the externally exposed portion of the first semiconductor layer and the externally exposed portion of the second semiconductor layer.

The process of forming the first semiconductor layer may include a process of forming the first semiconductor layer on a side surface of the semiconductor wafer, and the process of forming the second semiconductor layer may include a process of forming the second semiconductor layer on the side surface of the semiconductor wafer.

The portion of the first semiconductor layer removed by the plasma treatment process may include a portion formed on the side surface of the semiconductor wafer, and the portion of the second semiconductor layer removed by the plasma treatment process may include a portion formed on the side surface of the semiconductor wafer.

The first semiconductor layer formed on the side surface of the semiconductor wafer and the second semiconductor layer formed on the side surface of the semiconductor wafer may be connected to each other, and a connection between the first semiconductor layer and the second semiconductor layer may be cut off by the plasma treatment.

The plasma treatment process may include a process of removing particles provided on a surface of at least one of the first transparent conductive layer and the second transparent conductive layer.

One end and another end of the first semiconductor layer after the plasma treatment process may respectively match one end and another end of the first transparent conductive layer.

Moreover, the present invention provides a method of manufacturing a solar cell, the method including: a process of respectively forming a first semiconductor layer and a second semiconductor layer, connected to each other at a side surface of a semiconductor wafer, on an upper surface and a lower of the semiconductor wafer; a process of respectively forming a first transparent conductive layer and a second transparent conductive layer on an upper surface of the first semiconductor layer and a lower surface of the second semiconductor layer to externally expose a portion of the first semiconductor layer and a portion of the second semiconductor layer at a side surface of the semiconductor wafer; a process of removing the portion of the first semiconductor layer and the portion of the second semiconductor layer exposed at the side surface of the semiconductor wafer by using the first transparent conductive layer and the second transparent conductive layer as a mask to cut off an electrical connection between the first semiconductor layer and the second semiconductor layer; and a process of removing particles provided on a surface of at least one of the first transparent conductive layer and the second transparent conductive layer.

The process of removing the portion of the first semiconductor layer and the portion of the second semiconductor layer exposed at the side surface of the semiconductor wafer and the process of removing the particles may be simultaneously performed.

The process of removing the portion of the first semiconductor layer and the portion of the second semiconductor layer exposed at the side surface of the semiconductor wafer and the process of removing the particles may be simultaneously performed through plasma treatment.

One end and another end of the first semiconductor layer after process of removing the portion of the first semiconductor layer and the portion of the second semiconductor layer exposed at the side surface of the semiconductor wafer may respectively match one end and another end of the first transparent conductive layer.

Moreover, the present invention provides a solar cell including: a semiconductor wafer; a first semiconductor layer provided on an upper surface of the semiconductor wafer; a first transparent conductive layer provided on an upper surface of the first semiconductor layer; a second semiconductor layer provided on a lower surface of the semiconductor wafer, the second semiconductor layer having a polarity different from a polarity of the first semiconductor layer; and a second transparent conductive layer provided on a lower surface of the second semiconductor layer, wherein one end and another end of the first semiconductor layer match one end and another end of the first transparent conductive layer.

One end and another end of the second semiconductor layer may match one end and another end of the second transparent conductive layer.

The one end and the other end of the first semiconductor layer may not match one end and another end of the semiconductor wafer, and one end and another end of the second semiconductor layer may not match the one end and the other end of the semiconductor wafer.

Advantageous Effect

According to the present invention, the following effects are obtained.

According to an embodiment of the present invention, by performing plasma treatment on the upper surface of the first transparent conductive layer and the lower surface of the second transparent conductive layer, a connection between the first semiconductor layer and the second semiconductor layer is cut off at the side surface of the semiconductor wafer, thereby preventing occurrence of short circuit therebetween. Also, by performing plasma treatment on the upper surface of the first transparent conductive layer and the lower surface of the second transparent conductive layer, particles occurring in the upper surface of the first transparent conductive layer and the lower surface of the second transparent conductive layer are removed, thereby solving a problem where a transmittance of sunlight is reduced and a flow of a current is hindered by the particles.

MODE FOR INVENTION

Figure 1A:
FIGS. 1A to 1E are schematic process cross-sectional views illustrating a process of manufacturing a solar cell according to an embodiment of the related art.
Figure 1B:
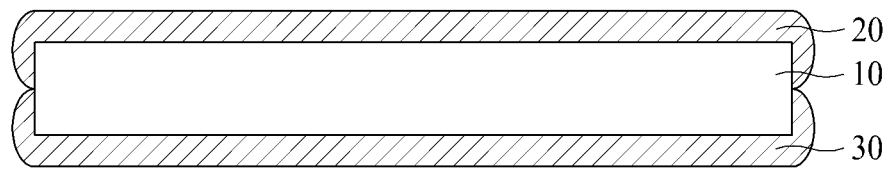
Figure 1C:
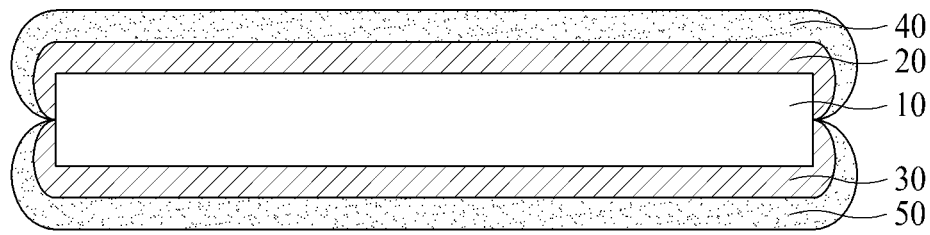
Figure 1D:
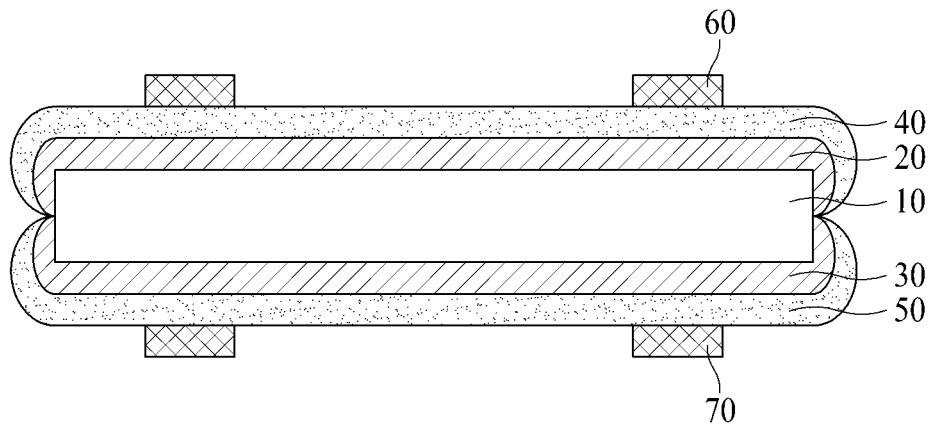
Figure 1E:
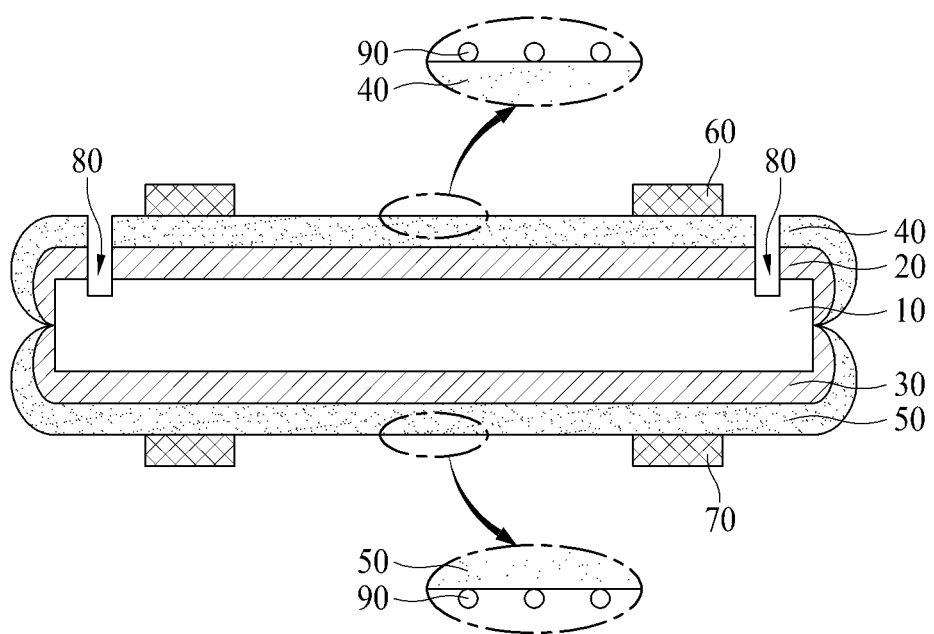

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known function or configuration is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~' a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, exemplary embodiments of the present invention will be described in detail with reference to the accompanying drawings.

FIGS. 2A to 2E are schematic process cross-sectional views illustrating a process of manufacturing a solar cell according to an embodiment of the present invention.

Figure 2A:
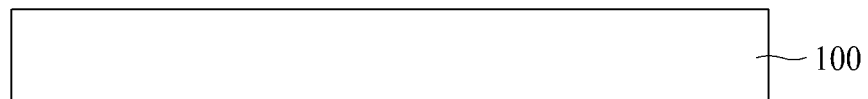
FIGS. 2A to 2E are schematic process cross-sectional views illustrating a process of manufacturing a solar cell according to an embodiment of the present invention.

First, as seen in FIG. 2A, a semiconductor wafer 100 is prepared.

The semiconductor wafer 100 has a certain electric conductive polarity. The semiconductor wafer 100 may be formed of a silicon wafer, and in detail, may be formed of an N-type silicon wafer or a P-type silicon wafer. Although not shown, an upper surface and a lower surface of the semiconductor wafer 100 may have a concave-convex structure, and in this case, in a below-described process, layers formed on the upper surface and the lower surface of the semiconductor wafer 100 are each formed in the concave-convex structure.

Figure 2B:
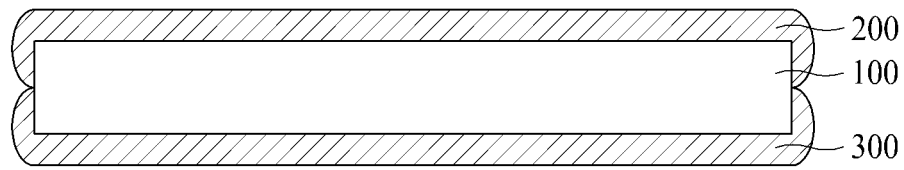

Subsequently, as seen in FIG. 2B, a first semiconductor layer 200 may be formed on one surface of the semiconductor wafer 100 (for example, an upper surface of the semiconductor wafer 100), and a second semiconductor layer 300 may be formed on the other surface of the semiconductor wafer 100 (for example, the lower surface of the semiconductor wafer 100).

The first semiconductor layer 200 may be formed on the one surface of the semiconductor wafer 100 in a thin film type, and in this case, the first semiconductor layer 200 may form a PN junction along with the semiconductor wafer 100. Therefore, if the semiconductor wafer 100 is formed of an N-type silicon wafer, the first semiconductor layer 200 may be formed of a P-type semiconductor layer. Particularly, the first semiconductor layer 200 may be formed of P-type amorphous silicon with Group III element such as boron (B) doped thereon. Generally, since a drift mobility of holes is lower than a drift mobility of electrons, it is preferable that a P-type semiconductor layer is formed close to a light receiving surface, in order to maximize a collection efficiency of holes based on incident light, and thus, it is preferable that the first semiconductor layer 200 close to the light receiving surface is formed of the P-type semiconductor layer.

The second semiconductor layer 300 is formed on the lower surface of the semiconductor wafer 100 in the thin film type, and in this case, the second semiconductor layer 300 is formed to have a polarity different from that of the first semiconductor layer 200. Therefore, if the first semiconductor layer 200 is formed of a P-type semiconductor layer with Group III element such as boron (B) doped thereon, the second semiconductor layer 300 is formed of an N-type semiconductor layer with Group 5 element such as phosphorous (P) doped thereon. Particularly, the second semiconductor layer 300 may be formed of N-type amorphous silicon.

The first semiconductor layer 200 and the second semiconductor layer 300 may be formed through a plasma enhanced chemical vapor deposition (PECVD) process. In this case, due to a process characteristic, the first semiconductor layer 200 is formed up to a side surface of the semiconductor wafer 100 as well as the upper surface of the semiconductor wafer 100, and the second semiconductor layer 300 is formed up to the side surface of the semiconductor wafer 100 as well as the lower surface of the semiconductor wafer 100. Therefore, as illustrated, the first semiconductor layer 200 and the second semiconductor layer 300 may be connected to each other at the side surface of the semiconductor wafer 100.

A process of forming the first semiconductor layer 200 and a process of forming the second semiconductor layer 300 are not limited to a special order therebetween.

Figure 2C:
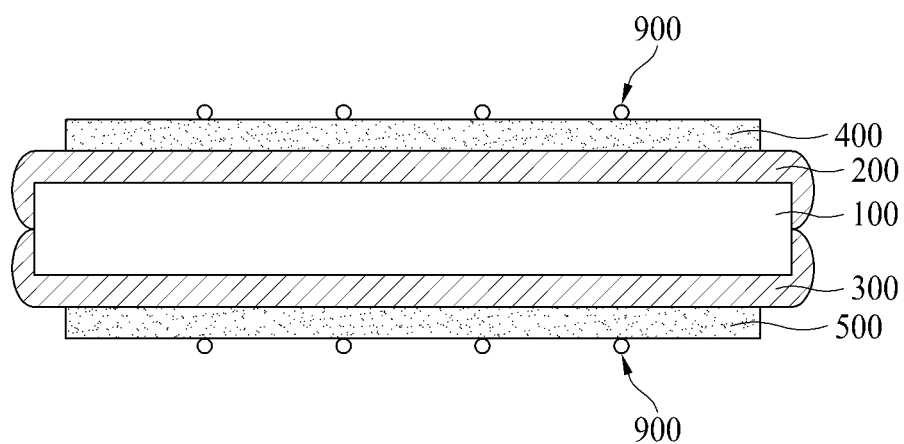

Subsequently, as seen in FIG. 2C, a first transparent conductive layer 400 is formed on one surface of the first semiconductor layer 200 (for example, an upper surface of the first semiconductor layer 200), and a second transparent conductive layer 500 is formed on the other surface of the second semiconductor layer 300 (for example, a lower surface of the second semiconductor layer 300).

The first transparent conductive layer 400 protects the first semiconductor layer 200, collects carriers (for example, holes) generated in the semiconductor wafer 100, and moves the collected holes to a below-described first electrode (see reference numeral 600 of FIG. 2E). The second transparent conductive layer 500 protects the second semiconductor layer 300, collects carriers (for example, electrons) generated in the semiconductor wafer 100, and moves the collected electrons to a below-described second electrode (see reference numeral 700 of FIG. 2E).

The first transparent conductive layer 400 and the second transparent conductive layer 500 may be formed of a transparent conductive material such as indium tin oxide (ITO), ZnOH, ZnO:B, ZnO:Al, AZO, or IWO.

The first transparent conductive layer 400 and the second transparent conductive layer 500 may be formed by using a sputtering process. In this case, by using a mask, the first transparent conductive layer 400 is formed on only the upper surface of the first semiconductor layer 200 without being formed on the side surface of the first semiconductor layer 200, and moreover, the second transparent conductive layer 500 is formed on only the lower surface of the second semiconductor layer 300 without being formed on the side surface of the second semiconductor layer 300. Therefore, the first semiconductor layer 200 and the second semiconductor layer 300 are exposed to the outside at the side surface of the semiconductor wafer 100.

In a case where the first transparent conductive layer 400 and the second transparent conductive layer 500 are formed by using the sputtering process, particles 900 which are pollutant components may be generated in an upper surface of the first transparent conductive layer 400 and a lower surface of the second transparent conductive layer 500. The particles 900 decrease a transmittance of sunlight and hinder a flow of a current to reduce an efficiency of the solar cell, and thus, are removed in a below-described process.

A process of forming the first transparent conductive layer 400 and a process of forming the second transparent conductive layer 500 are not limited to a special order therebetween.

Figure 2D:
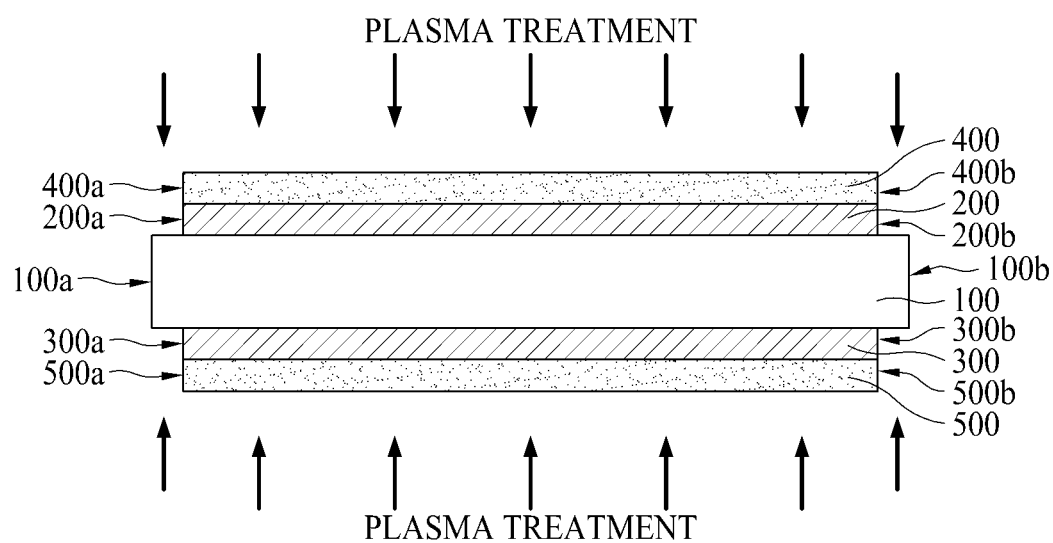

Subsequently, as seen in FIG. 2D, plasma treatment is performed on the upper surface of the first transparent conductive layer 400 and the lower surface of the second transparent conductive layer 500.

In this manner, when the plasma treatment is performed on the upper surface of the first transparent conductive layer 400 and the lower surface of the second transparent conductive layer 500, a portion of the first semiconductor 200 and a portion of the second semiconductor layer 300 exposed to the outside at the side surface of the semiconductor wafer 100 are removed. Therefore, a connection between the first semiconductor layer 200 and the second semiconductor layer 300 is cut off at the side surface of the semiconductor wafer 100, thereby preventing occurrence of short circuit therebetween.

In performing the plasma treatment, each of the first transparent conductive layer 400 and the second transparent conductive layer 500 may function as a mask, and thus, one end 200a and the other end 200b of the first semiconductor layer 200 from which the portion has been removed may match one end 400a and the other end 400b of the first transparent conductive layer 400, and one end 300a and the other end 300b of the second semiconductor layer 300 from which the portion has been removed may match one end 500a and the other end 500b of the second transparent conductive layer 500.

The one end 400a and the other end 400b of the first transparent conductive layer 400 may not match one end 100a and the other end 100b of the semiconductor wafer 100, and in this case, the one end 200a and the other end 200b of the first semiconductor layer 200 do not match the one end 100a and the other end 100b of the semiconductor wafer 100. Also, the one end 500a and the other end 500b of the second transparent conductive layer 500 may not match the one end 100a and the other end 100b of the semiconductor wafer 100, and in this case, the one end 300a and the other end 300b of the second semiconductor layer 300 do not match the one end 100a and the other end 100b of the semiconductor wafer 100.

Moreover, when the plasma treatment is performed on the upper surface of the first transparent conductive layer 400 and the lower surface of the second transparent conductive layer 500, the particles 900 occurring in the upper surface of the first transparent conductive layer 400 and the lower surface of the second transparent conductive layer 500 may be removed.

As described above, according to an embodiment of the present invention, by performing the plasma treatment on the upper surface of the first transparent conductive layer 400 and the lower surface of the second transparent conductive layer 500, the connection between the first semiconductor layer 200 and the second semiconductor layer 300 is cut off at the side surface of the semiconductor wafer 100 to prevent occurrence of short circuit therebetween, and moreover, the particles 900 are removed, thereby solving a problem where a transmittance of sunlight is reduced and a flow of a current is hindered by the particles 900. That is, a process of cutting off the connection between the first semiconductor layer 200 and the second semiconductor layer 300 and a process of removing the particles 900 may be simultaneously performed through the plasma treatment.

The plasma treatment may be performed to etch the first semiconductor layer 200, the second semiconductor layer 300, and the particles 900 without etching the first transparent conductive layer 400 and the second transparent conductive layer 500, and in detail, may use halogen plasma, for example, $Cl_2$ plasma. By irradiating the $Cl_2$ plasma, a $Cl_2$ gas may be ionized by a radio frequency (RF) power to generate ions, and the ions may be bonded to a silicon element configuring the first semiconductor layer 200 and the second semiconductor layer 300 and the particles 900, thereby performing dry etching.

Plasma treatment on the upper surface of the first transparent conductive layer 400 and plasma treatment on the lower surface of the second transparent conductive layer 500 are not limited to a special order therebetween.

Figure 2E:
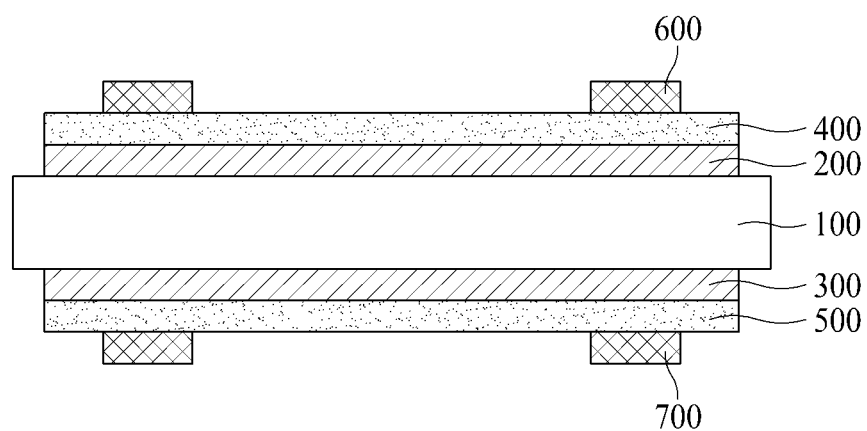

Subsequently, as seen in FIG. 2E, a first electrode 600 is formed on one surface of the first transparent conductive layer 400 (in detail, the upper surface of the first transparent conductive layer 400), and a second electrode 700 is formed on the other surface of the second transparent conductive layer 500 (in detail, the lower surface of the second transparent conductive layer 500).

The first electrode 600 configures a front surface of the solar cell, and thus, the first electrode 600 is pattern-formed in a certain form in order for sunlight to be transmitted to the inside of the solar cell.

The second electrode 700 configures a rear surface of the solar cell, and thus, may be wholly formed on the lower surface of the second transparent conductive layer 500 without being formed in a certain pattern. However, as illustrated, the second electrode 700 may also be pattern-formed in a certain form, and in this case, reflected sunlight may be incident through the rear surface of the solar cell.

The first electrode 600 and the second electrode 700 may be formed of a metal material, which is good in conductivity, such as Ag, Al, Ag+Al, Ag+Mg, Ag+Mn, Ag+Sb, Ag+Zn, Ag+Mo, Ag+Ni, Ag+Cu, or Ag+Al+Zn.

The first electrode 600 and the second electrode 700 may be formed through a printing process such as screen printing, inkjet printing, gravure printing, gravure offset printing, reverse printing, flexo printing, or micro contact printing.

A process of forming the first electrode 700 and a process of forming the second electrode 700 are not limited to a special order therebetween.

The above-described plasma treatment process illustrated in FIG. 2D may be performed after the process of forming the first electrode 600 and the second electrode 700 illustrated in FIG. 2E.

FIGS. 3A to 3E are schematic process cross-sectional views illustrating a process of manufacturing a solar cell according to another embodiment of the present invention. Hereinafter, descriptions of the same elements as the embodiment of FIGS. 2A to 2E are not repeated.

Figure 3A:
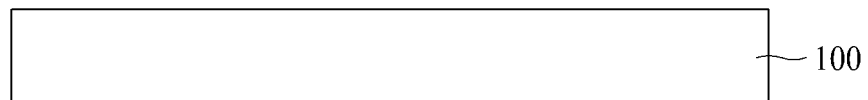
FIGS. 3A to 3E are schematic process cross-sectional views illustrating a process of manufacturing a solar cell according to another embodiment of the present invention.

First, as seen in FIG. 3A, a semiconductor wafer 100 is prepared.

Figure 3B:
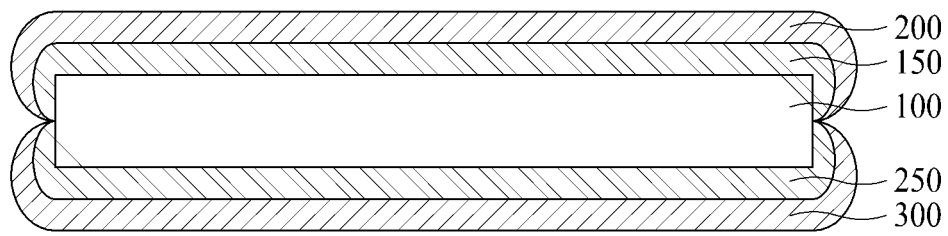

Subsequently, as seen in FIG. 3B, a first intrinsic semiconductor layer 150 is formed on one surface of the semiconductor wafer 100 (for example, an upper surface of the semiconductor wafer 100), and a first semiconductor layer 200 is formed on an upper surface of the first intrinsic semiconductor layer 150. Also, a second intrinsic semiconductor layer 250 is formed on the other surface of the semiconductor wafer 100 (for example, a lower surface of the semiconductor wafer 100), and a second semiconductor layer 300 is formed on a lower surface of the second intrinsic semiconductor layer 250.

The first intrinsic semiconductor layer 150 may be formed on the upper surface of the semiconductor wafer 100 through a process of forming an intrinsic (I) amorphous silicon layer by using a plasma enhanced chemical vapor deposition (PECVD) process, and the second intrinsic semiconductor layer 250 may be formed on the lower surface of the semiconductor wafer 100 through a process of forming an intrinsic (I) amorphous silicon layer by using a plasma enhanced chemical vapor deposition (PECVD) process.

As in the process of the above-described embodiment of FIG. 2B, when the first semiconductor layer 200 or the second semiconductor layer 300 is formed on a surface of the semiconductor wafer 100 by using a high-concentration dopant gas, there is a possibility that a defect occurs in the surface of the semiconductor wafer 100 due to the high-concentration dopant gas. In another embodiment of the present invention, the first intrinsic semiconductor layer 150 is formed on the upper surface of the semiconductor wafer 100, and then, the first semiconductor layer 200 is formed on the first intrinsic semiconductor layer 150, thereby preventing a defect from occurring in the upper surface of the semiconductor wafer 100. Also, the second intrinsic semiconductor layer 250 is formed on the lower surface of the semiconductor wafer 100, and then, the second semiconductor layer 300 is formed on the lower surface of the second intrinsic semiconductor layer 250, thereby preventing a defect from occurring in the lower surface of the semiconductor wafer 100.

Figure 3C:
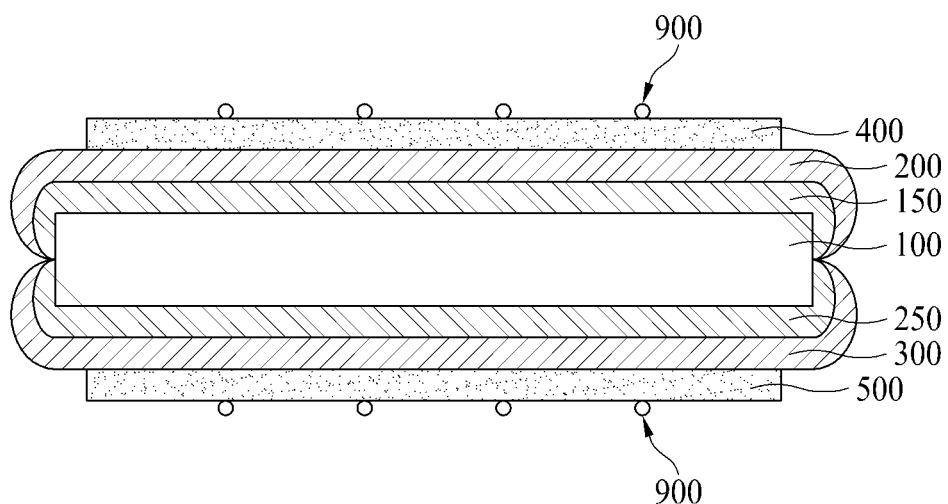

Subsequently, as seen in FIG. 3C, a first transparent conductive layer 400 is formed on one surface of the first semiconductor layer 200 (for example, an upper surface of the first semiconductor layer 200), and a second transparent conductive layer 500 is formed on the other surface of the second semiconductor layer 300 (for example, a lower surface of the second semiconductor layer 300).

The first transparent conductive layer 400 is formed on only the upper surface of the first semiconductor layer 200 without being formed on a side surface of the first semiconductor layer 200, and the second transparent conductive layer 500 is formed on only the lower surface of the second semiconductor layer 300 without being formed on a side surface of the second semiconductor layer 300. Therefore, the first semiconductor layer 200 and the second semiconductor layer 300 are exposed to the outside at a side surface of the semiconductor wafer 100.

At this time, particles 900 which are pollutant components may be generated in an upper surface of the first transparent conductive layer 400 and a lower surface of the second transparent conductive layer 500.

Figure 3D:
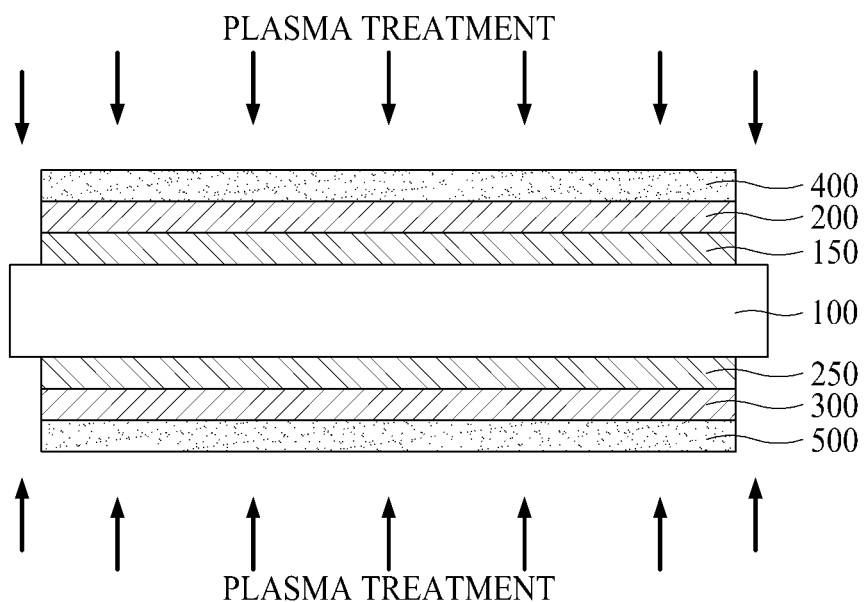

Subsequently, as seen in FIG. 3D, plasma treatment is performed on the upper surface of the first transparent conductive layer 400 and the lower surface of the second transparent conductive layer 500.

In this manner, by performing plasma treatment on the upper surface of the first transparent conductive layer 400 and the lower surface of the second transparent conductive layer 500, a portion of the first semiconductor 200 and a portion of the second semiconductor layer 300 exposed to the outside at the side surface of the semiconductor wafer 100 are removed, and simultaneously, the particles 900 are removed.

Figure 3E:
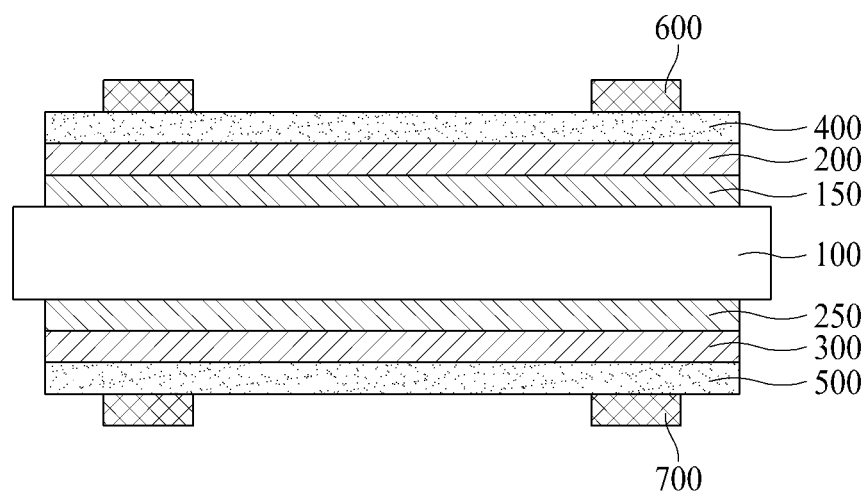

Subsequently, as seen in FIG. 3E, a first electrode 600 is formed on one surface of the first transparent conductive layer 400 (in detail, the upper surface of the first transparent conductive layer 400), and a second electrode 700 is formed on the other surface of the second transparent conductive layer 500 (in detail, the lower surface of the second transparent conductive layer 500).

Although not shown in detail, in the above-described embodiment of FIGS. 2A to 2E and the embodiment of FIGS. 3A to 3E, the first semiconductor layer 200 may be configured with a low-concentration doping layer and a high-concentration doping layer which are sequentially formed on the upper surface of the semiconductor wafer 100, and the second semiconductor layer 300 may be configured with a low-concentration doping layer and a high-concentration doping layer which are sequentially formed on the lower surface of the semiconductor wafer 100. Here, a low concentration and a high concentration are relative concepts, and the low-concentration doping layer denotes that a concentration of a dopant is relatively lower than the high-concentration doping layer.

Figure 4:
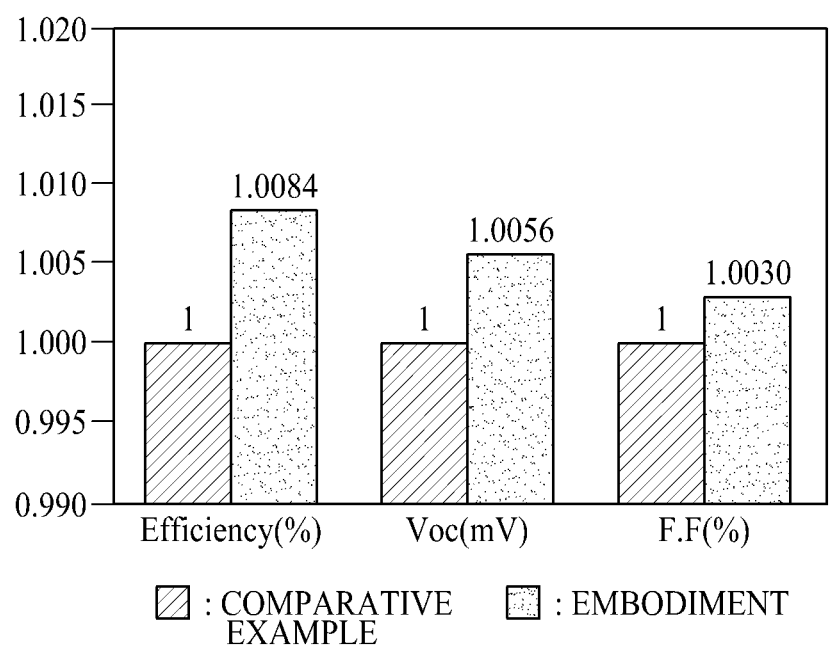
FIG. 4 is a graph showing a result obtained by measuring an efficiency of a solar cell according to an embodiment and an efficiency of a solar cell according to a comparative example.

FIG. 4 is a graph showing a result obtained by measuring an efficiency of a solar cell according to an embodiment and an efficiency of a solar cell according to a comparative example. The comparative example relates to a solar cell manufactured as in FIGS. 1A to 1E described above, and the embodiment relates to a solar cell manufactured as in FIGS. 2A to 2E described above.

As seen in FIG. 4, it can be seen that an efficiency, an open-circuit voltage Voc, and a fill factor FF of a solar cell are better in the embodiment than the comparative example.

Hereinabove, the embodiments of the present invention have been described in more detail with reference to the accompanying drawings, but the present invention is not limited to the embodiments and may be variously modified within a range which does not depart from the technical spirit of the present invention. Therefore, it should be understood that the embodiments described above are exemplary from every aspect and are not restrictive. It should be construed that the scope of the present invention is defined by the below-described claims instead of the detailed description, and the meanings and scope of the claims and all variations or modified forms inferred from their equivalent concepts are included in the scope of the present invention.

The invention claimed is:

1. A method of manufacturing a solar cell, the method comprising:
   a process of forming a first semiconductor layer on an upper surface and a lateral surface of a semiconductor wafer and forming a second semiconductor layer, having a polarity different from a polarity of the first semiconductor layer, on a lower surface and the lateral surface of the semiconductor wafer;
   a process of forming a first transparent conductive layer on an upper surface of the first semiconductor layer to externally expose a portion of the first semiconductor layer on the lateral surface of the semiconductor wafer and forming a second transparent conductive layer on a lower surface of the second semiconductor layer to externally expose a portion of the second semiconductor layer on the lateral surface of the semiconductor wafer; and
   a plasma treatment process on at least one of the first transparent conductive layer and the second transparent conductive layer,
   wherein the plasma treatment process comprises a process of removing the externally exposed portion of the first semiconductor layer and the externally exposed portion of the second semiconductor layer.

2. The method of claim 1, wherein
   the portion of the first semiconductor layer removed by the plasma treatment process comprises a portion formed on the lateral surface of the semiconductor wafer, and the portion of the second semiconductor layer removed by the plasma treatment process comprises a portion formed on the lateral surface of the semiconductor wafer.

3. The method of claim 2, wherein the first semiconductor layer formed on the lateral surface of the semiconductor wafer and the second semiconductor layer formed on the lateral surface of the semiconductor wafer are connected to each other, and
   a connection between the first semiconductor layer and the second semiconductor layer is cut off by the plasma treatment.

4. The method of claim 1, wherein the plasma treatment process comprises a process of removing particles provided on a surface of at least one of the first transparent conductive layer and the second transparent conductive layer.

5. The method of claim 1, wherein one end and another end of the first semiconductor layer after the plasma treatment process respectively match one end and another end of the first transparent conductive layer.

6. A method of manufacturing a solar cell, the method comprising:
   a process of respectively forming a first semiconductor layer and a second semiconductor layer, connected to each other at a lateral surface of a semiconductor wafer, on an upper surface and a lower of the semiconductor wafer;
   a process of respectively forming a first transparent conductive layer and a second transparent conductive layer on an upper surface of the first semiconductor layer and a lower surface of the second semiconductor layer to externally expose a portion of the first semiconductor layer and a portion of the second semiconductor layer at a lateral surface of the semiconductor wafer;
   a process of removing the portion of the first semiconductor layer and the portion of the second semiconductor layer exposed at the lateral surface of the semiconductor wafer by using the first transparent conductive layer and the second transparent conductive layer as a mask to cut off an electrical connection between the first semiconductor layer and the second semiconductor layer; and
   a process of removing particles provided on a surface of at least one of the first transparent conductive layer and the second transparent conductive layer.

7. The method of claim 6, wherein the process of removing the portion of the first semiconductor layer and the portion of the second semiconductor layer exposed at the lateral surface of the semiconductor wafer and the process of removing the particles are simultaneously performed.

8. The method of claim 7, wherein the process of removing the portion of the first semiconductor layer and the portion of the second semiconductor layer exposed at the lateral surface of the semiconductor wafer and the process of removing the particles are simultaneously performed through plasma treatment.

9. The method of claim 6, wherein one end and another end of the first semiconductor layer after process of removing the portion of the first semiconductor layer and the portion of the second semiconductor layer exposed at the lateral surface of the semiconductor wafer respectively match one end and another end of the first transparent conductive layer.

* * * * *